(12) United States Patent
Römer et al.

(10) Patent No.: US 10,233,388 B2
(45) Date of Patent: Mar. 19, 2019

(54) LIGHTING DEVICE WITH A FIRST PHOSPHOR AND FILTER PARTICLES

(71) Applicant: OSRAM Opto Semiconductors GmbH, Regensburg (DE)

(72) Inventors: Rebecca Römer, Regensburg (DE); Stefan Lange, Augsburg (DE); Dominik Eisert, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 11 days.

(21) Appl. No.: 15/303,836

(22) PCT Filed: Mar. 25, 2015

(86) PCT No.: PCT/EP2015/056437
§ 371 (c)(1),
(2) Date: Oct. 13, 2016

(87) PCT Pub. No.: WO2015/158516
PCT Pub. Date: Oct. 22, 2015

(65) Prior Publication Data
US 2017/0037308 A1    Feb. 9, 2017

(30) Foreign Application Priority Data

Apr. 17, 2014  (DE) .................. 10 2014 105 588
Jun. 5, 2014   (DE) .................. 10 2014 107 972

(51) Int. Cl.
*C09K 11/02* (2006.01)
*C09K 11/08* (2006.01)
(Continued)

(52) U.S. Cl.
CPC ........ *C09K 11/025* (2013.01); *C09K 11/0883* (2013.01); *C09K 11/7734* (2013.01);
(Continued)

(58) Field of Classification Search
CPC .............. C09K 11/025; C09K 11/7734; C09K 11/0883; H01L 33/507; H01L 33/56; H01L 33/44; H01L 33/504; H01L 33/501
See application file for complete search history.

(56) References Cited

U.S. PATENT DOCUMENTS 4,339,501 A    7/1982  Inoue et al.
4,780,752 A   10/1988  Angerstein et al.
(Continued)

FOREIGN PATENT DOCUMENTS

DE    30 03 699 A1    8/1980
DE    31 17 571 A1   11/1982
(Continued)

OTHER PUBLICATIONS

Jeong Rok Oh et at, "The realization of a whole palette of colors in a green gap by monochromatic phosphor-converted light-emitting diodes," Optics Express, vol. 19, No. 5, Feb. 28, 2011, pp. 4188-4198.
(Continued)

*Primary Examiner* — Yosef Gebreyesus
(74) *Attorney, Agent, or Firm* — DLA Piper LLP (US)

(57) ABSTRACT

A lighting device includes a radiation source that emits primary radiation in the wavelength range of 300 nm to 570 nm, a first phosphor arranged in a beam path of the primary radiation source that converts at least part of the primary radiation into secondary radiation in an orange to red wavelength range of 570 nm to 800 nm, and filter particles arranged in a beam path of the secondary radiation that absorb at least part of the secondary radiation.

16 Claims, 13 Drawing Sheets

(51) Int. Cl.
*C09K 11/77* (2006.01)
*H01L 33/50* (2010.01)
*H01L 33/44* (2010.01)
*H01L 33/56* (2010.01)

(52) U.S. Cl.
CPC ............ *H01L 33/44* (2013.01); *H01L 33/504* (2013.01); *H01L 33/507* (2013.01); *H01L 33/56* (2013.01); *H01L 33/501* (2013.01)

(56) References Cited

U.S. PATENT DOCUMENTS

| | | | |
|---|---|---|---|
| 2004/0217364 A1* | 11/2004 | Tarsa ................. | H01L 25/0753 257/89 |
| 2006/0022146 A1* | 2/2006 | Juestel ............... | C09K 11/7706 250/484.4 |
| 2006/0255710 A1* | 11/2006 | Mueller-Mach ...... | C04B 35/581 313/485 |
| 2008/0105887 A1* | 5/2008 | Narendran ........... | B82Y 10/00 257/98 |
| 2008/0265749 A1* | 10/2008 | Bechtel ................ | H01L 33/44 313/503 |
| 2009/0242917 A1* | 10/2009 | Inoue .................. | H01L 33/504 257/98 |
| 2009/0322209 A1* | 12/2009 | Becker ................ | C09K 11/7734 313/503 |
| 2012/0153226 A1* | 6/2012 | Comanzo ............ | C09K 11/663 252/301.6 F |
| 2013/0002124 A1* | 1/2013 | Izumi ................. | H01L 33/504 313/498 |
| 2013/0009541 A1* | 1/2013 | Zheng ................ | C09K 11/0883 313/503 |
| 2013/0038202 A1* | 2/2013 | Donners .............. | H01J 61/40 313/485 |
| 2013/0062637 A1* | 3/2013 | Reed ................. | H01L 33/50 257/89 |
| 2013/0168605 A1* | 7/2013 | Li ..................... | C09K 11/7731 252/301.4 F |
| 2013/0241391 A1* | 9/2013 | Takei ................. | H01L 25/0753 313/112 |
| 2014/0008680 A1* | 1/2014 | Won .................. | C09K 11/0883 257/98 |
| 2014/0008684 A1 | 1/2014 | Ronda et al. | |
| 2014/0362557 A1* | 12/2014 | Ulasyuk ............... | F21K 9/56 362/84 |
| 2015/0123156 A1* | 5/2015 | Eberhardt ............ | H05B 33/14 257/98 |

FOREIGN PATENT DOCUMENTS

| | | |
|---|---|---|
| DE | 10 2009 025 266 A1 | 12/2010 |
| DE | 10 2010 025 608 A1 | 1/2012 |
| DE | 10 2012 111 123 A1 | 3/2014 |
| DE | 10 2012 109 217 A1 | 4/2014 |
| EP | 0 143 383 A2 | 6/1985 |
| EP | 1 696 016 A1 | 8/2006 |
| EP | 2 544 318 A1 | 1/2013 |
| WO | 01/39574 A1 | 6/2001 |
| WO | 2004/055910 A1 | 7/2004 |
| WO | 2005/052087 A1 | 6/2005 |
| WO | 2010/057745 A1 | 5/2010 |
| WO | WO 2015/052238 A1 | 4/2015 |

OTHER PUBLICATIONS

Ji Hye Oh et at, "New paradigm of multi-chip white LEDs: combination of an InGaN blue LED and full down-converted phosphor-converted LEDs," Optics Expres, vol. 19, No. S3, May 9, 2011, pp. A270-A279.

* cited by examiner

Fig. 2A

| | λ.dom (blue LED) | Phosphor | Filter | Filter concentration | Phosphor concentration | x | y | λ.dom | color purity | Φe(filled)/Φe (nocast) | Φv(filled)/Φe (nocast) |
|---|---|---|---|---|---|---|---|---|---|---|---|
| Comparative Example 1 | 448 nm | $(Ca_{0.1}Sr_{0.4}Ba_{0.5})_2Si_5N_8$ (3.5% Eu) | / | 0% | 40% | 0.667 | 0.332 | 611 nm | 100% | 100% | 100% |
| Comparative Example 2 | 449 nm | $(Ca_{0.025}Sr_{0.475}Ba_{0.5})_2Si_5N_8$ (5% Eu) | / | 0% | 15% | 0.624 | 0.342 | 607 nm | 90% | 162% | 209% |
| Embodiment 1 | 449 nm | $(Ca_{0.025}Sr_{0.475}Ba_{0.5})_2Si_5N_8$ (5% Eu) | ground HOYA R-60 | 30% | 15% | 0.668 | 0.331 | 611 nm | 100% | 126% | 131% |

Fig. 3A

| | λdom (blue LED) | Phosphor | Filter | Filter concentration | Phosphor concentration | x | y | λdom | color purity | Φe(filled) / Φe (nocast) | Φv(filled) / Φe (nocast) |
|---|---|---|---|---|---|---|---|---|---|---|---|
| Comparative Example 3 | 448 nm | (Ca₀.₁Sr₀.₄Ba₀.₅)₂Si₅N₈ (6% Eu) | / | 0% | 20% | 0.661 | 0.335 | 610 nm | 99 % | 100% | 100% |
| Comparative Example 4 | 448 nm | (Ca₀.₀₂₅Sr₀.₄₇₅Ba₀.₅)₂Si₅N₈ (3.5% Eu) | / | 0% | 15% | 0.611 | 0.350 | 605 nm | 88 % | 129% | 199% |
| Embodiment 2 | 448 nm | (Ca₀.₀₂₅Sr₀.₄₇₅Ba₀.₅)₂Si₅N₈ (3.5% Eu) | 1:1 mixture of ground HOYA R-60 and ground SCHOTT RG610 | 20% | 15% | 0.660 | 0.336 | 609 nm | 99 % | 97% | 116% |

Fig. 4A

| | λdom (blue LED) | Phosphor | Filter | Phosphor/ Filter | Powder concentration | x | y | λdom | color purity | Φe(filled) / Φe (nocast) | Φv(filled) / Φe (nocast) |
|---|---|---|---|---|---|---|---|---|---|---|---|
| Comparative Example 5 | 448 nm | (Ca$_{0.3}$Sr$_{0.7}$)$_2$Si$_5$N$_8$ (2% Eu) | / | / | 30% | 0.665 | 0.334 | 610 nm | 100 % | 100% | 100% |
| Embodiment 3 | 447 nm | (Ca$_{0.025}$Sr$_{0.475}$Ba$_{0.5}$)$_2$Si$_5$N$_8$ (5% Eu) | CaAlSi(N,O)$_3$: Eu(0.4%) | 1 / 1.3 | 21.5% | 0.661 | 0.329 | 612 nm | 97 % | 107% | 105% |

Fig. 5/1

| | composition Ca$_{1-x}$Sr$_x$AlSiN$_3$:yEu or Sr(Sr$_a$Ca$_{1-a}$)Si$_2$Al$_2$N$_6$:yEu (a=2x-1) | | weighted-in amounts / g | | | | | | | | | | optical characterization | |
|---|---|---|---|---|---|---|---|---|---|---|---|---|---|---|
| Versuch | y | x | Ca3N2 | Sr3N2 | AlF3 | SrF2 | BaF2 | Li2B4O7 | LiBF4 | Si3N4 | AlN | Eu2O3 | Gesamt | CIE x | CIE y |
| FH 005_13 | 0,6% | 0,8 | 2,746 | 21,552 | 0,875 | 0,436 | 0 | 0 | 0 | 12,993 | 11,104 | 0,293 | 50 | 0,632 | 0,365 |
| FH 006_13 | 0,6% | 0,8 | 2,730 | 21,428 | 0,290 | 1,301 | 0 | 0 | 0 | 12,918 | 11,040 | 0,292 | 50 | 0,632 | 0,365 |
| FH 007_13 | 0,6% | 0,8 | 2,729 | 21,416 | 0,232 | 1,387 | 0 | 0 | 0 | 12,911 | 11,034 | 0,292 | 50 | 0,634 | 0,364 |
| FH 008_13 | 0,6% | 0,8 | 2,748 | 21,564 | 0,934 | 0,349 | 0 | 0 | 0 | 13,000 | 11,111 | 0,294 | 50 | 0,632 | 0,365 |
| FH 009_13 | 0,6% | 0,8 | 2,738 | 21,492 | 1,163 | 0 | 0 | 0 | 0 | 12,957 | 11,357 | 0,293 | 50 | 0,631 | 0,366 |
| FH 010_13 | 0,6% | 0,8 | 2,646 | 20,769 | 1,124 | 1,682 | 0 | 0 | 0 | 12,521 | 10,975 | 0,283 | 50 | 0,631 | 0,366 |
| FH 011_13 | 0,6% | 0,8 | 2,574 | 20,202 | 1,641 | 2,454 | 0 | 0 | 0 | 12,179 | 10,676 | 0,275 | 50 | 0,633 | 0,364 |
| FH 012_13 | 0,6% | 0,8 | 2,506 | 19,665 | 2,129 | 3,185 | 0 | 0 | 0 | 11,855 | 10,392 | 0,268 | 50 | 0,632 | 0,364 |
| FH 013_13 | 0,6% | 0,8 | 2,731 | 21,434 | 0 | 0 | 0 | 0 | 1,295 | 12,922 | 11,326 | 0,292 | 50 | 0,635 | 0,363 |
| FH 014_13 | 0,6% | 0,8 | 2,735 | 21,463 | 0,581 | 0 | 0 | 0 | 0,648 | 12,939 | 11,342 | 0,292 | 50 | 0,633 | 0,364 |
| FH 015_13 | 0,6% | 0,8 | 2,719 | 21,340 | 0,000 | 0,864 | 0 | 0 | 0,645 | 12,865 | 11,277 | 0,290 | 50 | 0,634 | 0,364 |
| FH 016_13 | 0,6% | 0,8 | 2,725 | 21,389 | 0,387 | 0,578 | 0 | 0 | 0,432 | 12,895 | 11,303 | 0,291 | 50 | 0,633 | 0,364 |
| FH 029_13 | 0,6% | 0,8 | 2,671 | 20,961 | 0 | 0 | 2,369 | 0 | 0 | 12,637 | 11,077 | 0,285 | 50 | 0,633 | 0,364 |
| FH 030_13 | 0,6% | 0,8 | 2,704 | 21,223 | 0,574 | 0 | 1,199 | 0 | 0 | 12,795 | 11,215 | 0,289 | 50 | 0,631 | 0,366 |
| FH 031_13 | 0,6% | 0,8 | 2,689 | 21,103 | 0,000 | 0,854 | 1,193 | 0 | 0 | 12,722 | 11,152 | 0,287 | 50 | 0,630 | 0,367 |
| FH 032_13 | 0,6% | 0,8 | 2,701 | 21,195 | 0,000 | 0 | 1,198 | 0 | 0,640 | 12,778 | 11,200 | 0,289 | 50 | 0,636 | 0,361 |
| FH 037_13 | 0,4% | 0,6 | 5,741 | 16,896 | 0,305 | 1,368 | 0 | 0 | 0 | 13,581 | 11,905 | 0,204 | 50 | 0,636 | 0,360 |
| FH 038_13 | 0,4% | 0,6 | 5,738 | 16,886 | 0,244 | 1,458 | 0 | 0 | 0 | 13,573 | 11,897 | 0,204 | 50 | 0,635 | 0,361 |
| FH 039_13 | 0,4% | 0,6 | 5,776 | 16,999 | 0,920 | 0,459 | 0 | 0 | 0 | 13,664 | 11,977 | 0,206 | 50 | 0,637 | 0,359 |
| FH 040_13 | 0,4% | 0,6 | 5,779 | 17,009 | 0,982 | 0,367 | 0 | 0 | 0 | 13,672 | 11,984 | 0,206 | 50 | 0,638 | 0,358 |
| FH 041_13 | 0,4% | 0,6 | 5,793 | 17,048 | 0,000 | 0 | 0 | 0 | 1,239 | 13,703 | 12,011 | 0,206 | 50 | 0,636 | 0,359 |
| FH 042_13 | 0,4% | 0,6 | 5,793 | 17,049 | 0,615 | 0 | 0 | 0 | 0,620 | 13,704 | 12,012 | 0,206 | 50 | 0,640 | 0,356 |
| FH 043_13 | 0,4% | 0,6 | 5,758 | 16,946 | 0 | 0,915 | 0 | 0 | 0,616 | 13,621 | 11,940 | 0,205 | 50 | 0,639 | 0,357 |
| FH 044_13 | 0,4% | 0,6 | 5,785 | 17,025 | 0 | 0 | 0 | 0,619 | 0,686 | 13,685 | 11,995 | 0,206 | 50 | 0,642 | 0,354 |

Fig. 5/2

| Versuch | composition $Ca_{1-x}Sr_xAlSiN_3$:yEu or $Sr(S_aCa_{1-a})Si_2Al_2N_6$:yEu (a=2x-1) | | weighted-in amounts / g | | | | | | | | | | optical characterization | | |
|---|---|---|---|---|---|---|---|---|---|---|---|---|---|---|---|
| | y | x | Ca3N2 | Sr3N2 | AlF3 | SrF2 | BaF2 | Li2B4O7 | LiBF4 | Si3N4 | AlN | Eu2O3 | Gesamt | CIE x | CIE y |
| FH 046_13 | 0,4% | 0,6 | 5,747 | 16,913 | 0 | 1,205 | 0 | 0,418 | 0 | 13,595 | 11,917 | 0,205 | 50 | 0,639 | 0,358 |
| FH 047_13 | 0,4% | 0,6 | 5,737 | 16,885 | 0 | 1,458 | 0 | 0,245 | 0 | 13,573 | 11,897 | 0,204 | 50 | 0,639 | 0,358 |
| FH 048_13 | 0,4% | 0,6 | 5,782 | 17,017 | 0 | 0 | 0 | 0,421 | 0,905 | 13,679 | 11,990 | 0,206 | 50 | 0,640 | 0,356 |
| FH 049_13 | 0,4% | 0,6 | 5,780 | 17,011 | 0 | 0 | 0 | 0,247 | 1,096 | 13,674 | 11,986 | 0,206 | 50 | 0,640 | 0,356 |
| FH 050_13 | 0,4% | 0,6 | 5,793 | 17,050 | 0,809 | 0 | 0 | 0,421 | 0 | 13,707 | 12,013 | 0,206 | 50 | 0,639 | 0,357 |
| FH 051_13 | 0,4% | 0,6 | 5,793 | 17,049 | 0,984 | 0 | 0 | 0,248 | 0 | 13,707 | 12,013 | 0,206 | 50 | 0,639 | 0,358 |
| FH 052_13 | 0,4% | 0,6 | 5,770 | 16,980 | 0,408 | 0,611 | 0 | 0,411 | 0 | 13,651 | 11,964 | 0,205 | 50 | 0,639 | 0,358 |
| FH 053_13 | 0,4% | 0,6 | 5,725 | 17,196 | 0,486 | 0,728 | 0 | 0,245 | 0 | 13,545 | 11,871 | 0,204 | 50 | 0,639 | 0,358 |
| FH 058_13 | 0,4% | 0,6 | 5,704 | 17,134 | 0,906 | 0,606 | 0 | 0,122 | 0 | 13,496 | 11,828 | 0,203 | 50 | 0,639 | 0,360 |
| FH 059_13 | 0,4% | 0,6 | 5,753 | 17,280 | 0,000 | 1,100 | 0 | 0,123 | 0 | 13,611 | 11,929 | 0,205 | 50 | 0,636 | 0,360 |
| FH 060_13 | 0,4% | 0,6 | 5,793 | 17,049 | 1,107 | 0,000 | 0 | 0,124 | 0 | 13,707 | 12,013 | 0,206 | 50 | 0,637 | 0,358 |
| FH 061_13 | 0,4% | 0,6 | 5,722 | 17,186 | 0,818 | 0,548 | 0 | 0,122 | 0 | 13,537 | 11,864 | 0,204 | 50 | 0,638 | 0,359 |
| FH 064_13 | 0,8% | 0,8 | 2,791 | 21,907 | 0,119 | 0 | 0 | 0 | 0 | 13,209 | 11,577 | 0,398 | 50 | 0,634 | 0,364 |
| FH 065_13 | 1,0% | 0,8 | 2,786 | 21,863 | 0,118 | 0 | 0 | 0 | 0 | 13,183 | 11,554 | 0,496 | 50 | 0,638 | 0,360 |
| FH 066_13 | 1,2% | 0,8 | 2,780 | 21,820 | 0,118 | 0 | 0 | 0 | 0 | 13,157 | 11,531 | 0,594 | 50 | 0,641 | 0,357 |
| FH 067_13 | 1,2% | 0,9 | 1,354 | 23,908 | 0,115 | 0 | 0 | 0 | 0 | 12,814 | 11,230 | 0,579 | 50 | 0,633 | 0,366 |
| FH 068_13 | 1,2% | 0,875 | 1,704 | 23,397 | 0,116 | 0 | 0 | 0 | 0 | 12,898 | 11,304 | 0,582 | 50 | 0,636 | 0,362 |
| FH 069_13 | 1,2% | 0,85 | 2,058 | 22,878 | 0,117 | 0 | 0 | 0 | 0 | 12,983 | 11,378 | 0,586 | 50 | 0,640 | 0,358 |
| FH 070_13 | 1,2% | 0,825 | 2,417 | 22,353 | 0,117 | 0 | 0 | 0 | 0 | 13,069 | 11,454 | 0,590 | 50 | 0,642 | 0,356 |
| FH 079_13 | 1,2% | 0,925 | 1,009 | 24,413 | 0,114 | 0 | 0 | 0 | 0 | 12,731 | 11,158 | 0,575 | 50 | 0,628 | 0,370 |
| FH 080_13 | 1,2% | 0,95 | 0,668 | 24,912 | 0,114 | 0 | 0 | 0 | 0 | 12,649 | 11,086 | 0,571 | 50 | 0,626 | 0,372 |
| FH 081_13 | 1,5% | 0,8 | 2,772 | 21,756 | 0,118 | 0 | 0 | 0 | 0 | 13,118 | 11,497 | 0,740 | 50 | 0,645 | 0,353 |
| FH 082_13 | 2,0% | 0,8 | 2,759 | 21,649 | 0,117 | 0 | 0 | 0 | 0 | 13,053 | 11,440 | 0,982 | 50 | 0,654 | 0,345 |
| TF 88/12 | 0,5% | 0,7 | 8,632 | 39,518 | 0,244 | 0 | 0 | 0 | 0 | 27,227 | 23,866 | 0,512 | 100 | 0,635 | 0,364 |
| TF 93/12 | 0,6% | 0,8 | 5,594 | 43,903 | 0,238 | 0 | 0 | 0 | 0 | 26,468 | 23,200 | 0,598 | 100 | 0,638 | 0,361 |
| TF 99/12 | 0,5% | 0,7 | 8,632 | 39,518 | 0,244 | 0 | 0 | 0 | 0 | 27,227 | 23,866 | 0,512 | 100 | 0,632 | 0,366 |

Fig. 5/3

| | composition Ca₁₋ₓSrₓAlSiN₃:yEu or Sr(SrₐCa₁₋ₐ)Si₂Al₂N₆:yEu (a=2x-1) | | weighted-in amounts / g | | | | | | | | | optical characterization | | |
|---|---|---|---|---|---|---|---|---|---|---|---|---|---|---|
| Versuch | y | x | Ca3N2 | Sr3N2 | AlF3 | SrF2 | BaF2 | Li2B4O7 | LiBF4 | Si3N4 | AlN | Eu2O3 | Gesamt | CIE x | CIE y |
| TF 100/12 | 0,6% | 0,8 | 5,594 | 43,903 | 0,238 | 0 | 0 | 0 | 0 | 26,468 | 23,200 | 0,598 | 100 | 0,628 | 0,371 |
| TF 103/12 | 0,5% | 0,8 | 5,600 | 43,947 | 0,238 | 0 | 0 | 0 | 0 | 26,494 | 23,223 | 0,499 | 100 | 0,624 | 0,375 |
| TF 131/12 | 0,6% | 0,9 | 2,724 | 48,097 | 0,231 | 0 | 0 | 0 | 0 | 25,774 | 22,592 | 0,582 | 100 | 0,622 | 0,377 |
| TF 132/12 | 0,7% | 0,9 | 2,721 | 48,050 | 0,231 | 0 | 0 | 0 | 0 | 25,749 | 22,570 | 0,678 | 100 | 0,624 | 0,375 |
| TF 133/12 | 0,8% | 0,9 | 2,719 | 48,004 | 0,231 | 0 | 0 | 0 | 0 | 25,724 | 22,548 | 0,774 | 100 | 0,626 | 0,372 |
| TF 161/12 | 1,0% | 0,9 | 2,713 | 47,911 | 0,231 | 0 | 0 | 0 | 0 | 25,674 | 22,505 | 0,966 | 100 | 0,635 | 0,364 |
| TF 162/12 | 1,2% | 0,9 | 2,708 | 47,818 | 0,230 | 0 | 0 | 0 | 0 | 25,625 | 22,461 | 1,157 | 100 | 0,637 | 0,362 |
| TF 163/12 | 0,6% | 0,85 | 4,140 | 46,028 | 0,235 | 0 | 0 | 0 | 0 | 26,116 | 22,892 | 0,590 | 100 | 0,624 | 0,374 |
| TF 168/12 | 0,9% | 0,9 | 2,716 | 47,957 | 0,231 | 0 | 0 | 0 | 0 | 25,699 | 22,527 | 0,870 | 100 | 0,629 | 0,370 |
| TF 169/12 | 1,2% | 0,95 | 1,337 | 49,826 | 0,227 | 0 | 0 | 0 | 0 | 25,295 | 22,173 | 1,142 | 100 | 0,631 | 0,368 |

LIGHTING DEVICE WITH A FIRST PHOSPHOR AND FILTER PARTICLES

TECHNICAL FIELD

This disclosure relates to a lighting device with a first phosphor and filter particles.

BACKGROUND

In many lighting applications and optical applications, for example, rear lights, brake lights of motor vehicles as well as traffic lights, monitors and RGB-applications, light sources in the deep-red range are oftentimes required.

Usually, InGaAlP-LEDs may be used, which emit light in the red spectral range. However, the LEDs come with the disadvantage that they provide good efficiency only at low temperatures, with the efficiency rapidly dropping along with an increase in temperature. Another option lies with the conversion of the radiation of blue-emitting LEDs into red light by conventional phosphors, which often have the general formula $M_2(Al,Si)_5(N,O)_8$ with M=Ca, Sr, Ba and doping with europium. The problem in connection with such arrangements is that the phosphors often have good stability, but rather emit at shorter wavelengths, thus requiring very high concentrations of the phosphors to realize a deep-red lighting device with an LED as a primary light source. Such high concentrations are to ensure that re-absorption of the short-wave ranges of the converted radiation is effected by further luminescent particles, resulting in a shift of the total emission toward longer wavelengths. A high self-absorption results in high losses in terms of brightness. Further, high concentrations of the phosphor can be hardly processed.

Another option of realizing red-emitting lighting devices lies with the production of a deep-red emitting phosphor of the general formula $M_2(Al,Si)_5(N,O)_8$ with M=Ca, Sr, Ba. However, this often requires high fractions of strontium as well as europium in the phosphor, which proved to be instable when exposed to radiation and temperature, for example, in LED applications.

Another option for deep-red lighting applications lies with the application of $CaAlSiN_3$ phosphors, as described in EP 1 696 016 A1, for example. However, such phosphors exhibit good optical properties only with low dopant concentrations so that high amounts of phosphors are once again required for the realization of a deep-red application. However, in phosphor concentrations this high, scattering effects occur and, further, high phosphor concentrations can only hardly be processed.

SUMMARY

We provide a light device including a radiation source that emits primary radiation in the wavelength range of 300 nm to 570 nm, a first phosphor arranged in a beam path of the primary radiation source that converts at least part of the primary radiation into secondary radiation in an orange to red wavelength range of 570 nm to 800 nm, and filter particles arranged in a beam path of the secondary radiation that absorb at least part of the secondary radiation.

We also provide a lighting device including a radiation source that emits primary radiation in a wavelength range of 300 nm to 570 nm, a first phosphor arranged in a beam path of the primary radiation source that converts at least part of the primary radiation into secondary radiation in an orange to red wavelength range of 570 nm to 800 nm, and filter particles including or consisting of ground filter glass arranged in a beam path of the secondary radiation that absorb at least part of the secondary radiation, wherein the transmission spectrum of the filter particles has a cut-off-wavelength of 590 nm to 640 nm.

BRIEF DESCRIPTION OF THE DRAWINGS

FIGS. 2A to 4B, in table form, show the composition with respect to the phosphors and the filter particles, as well as the x and y CIE chromaticity coordinates with the light current and the radiation power of various of our lighting devices and conventional lighting devices as comparative examples as well as the respective LED emission spectra.

FIGS. 5/1 to 5/3 show the weighted-in amounts for different phosphors of the general molecular formula $Sr(Sr_aCa_{1-a})Si_2Al_2N_6$:D as well as for other conventional phosphors.

DETAILED DESCRIPTION

Figure 1A:
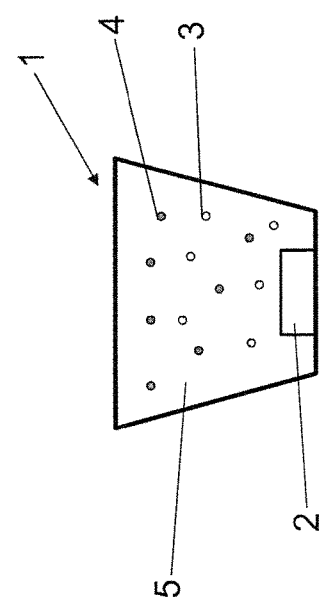
FIGS. 1A to 1G show various examples of lighting devices in cross-section.

We provide:
A lighting device comprising:
 a radiation source that emits primary radiation in the wavelength range of 300 nm to 570 nm,
 a first phosphor arranged in the beam path of the primary radiation source that converts at least part of the primary radiation into secondary radiation in an orange to red wavelength range of 570 nm to 800 nm, preferably 580 nm to 650 nm, further preferably 590 nm to 640 nm, further preferably 590 nm to 630 nm as well as
 filter particles arranged in the beam path of the secondary radiation absorb at least part of the secondary radiation.

Furthermore, the first phosphor is also capable of converting the primary radiation into secondary radiation of a wavelength range of 580 nm to 630 nm, or 590 nm to 620 nm.

The advantage of the lighting device is that on the one hand filter particles, in particular pulverulent filter particles are used which can be processed in an especially well manner compared to bigger filter discs or filter layers. In filter particles, in particular the concentration of the particles may be individually adapted to a phosphor application to be achieved in a particularly simple manner.

Another advantage of the lighting device is that the filter particles absorb at least part of the red, orange or yellow-green secondary radiation of the first phosphor so that an emission with a narrower band can be achieved compared to lighting devices that do not comprise the filter particles. Furthermore, by the filter particles, desired color locations for certain applications such as in the automotive sector (blinker, brake light), can be set in a particularly simple manner.

For example, inorganic semiconductor diodes (LEDs) or organic light-emitting diodes (OLEDs) may be used as radiation sources radiating the primary radiation. When using point light sources, for example, LEDs, use of filter particles is particularly advantageous due to the fact that the particles can be used in low amounts in lighting devices in a particularly simple manner in a pulverulent form along with concentrations that can be well adjusted. Further, the LED or OLED of the primary light source can emit radiation preferably in a range of greater than 300 nm up to 500 nm maximum.

The particles of the filter particles may particularly preferably have a grain size of <50 μm, further preferably <40 μm, further preferably <31 μm. In such particle sizes, a well absorption of the primary radiation is ensured on the one hand, but on the other hand excessive back-scattering of the primary radiation at the filter particles is reduced.

Use of ground glass filters is particularly preferred. Glass filters may be glass-type filters, for example, that contain ions of heavy metals or rare earths that effect a corresponding coloration and absorption characteristic of the glasses. Inorganic salts and even oxides of various metals can be used as coloring compounds, which absorb the respective radiation of the primary radiation source. Glass filters of this type with inorganic coloring metal compounds, also colloidal colored glasses, may be obtained as filter discs and be subsequently ground in a particularly simple manner so that the filter particles of the lighting devices can be obtained in a particularly simple manner. Particularly preferably, so-called long pass filters can be used as filter particles, which absorb an undesired short-wave wavelength range and passed only by light of longer wavelengths, in particular in the red wavelength range. Particularly preferably, long pass filters can be used as filter particles, the transmission spectrum of which have a cut-off wavelength of 590 nm to 640 nm, preferably 590 to 610 nm, further preferably 590 nm to 630 nm or 590 to 620 nm, with the cut-off wavelength indicating the wavelength at which a long pass filter transmits 50% of the radiation. In longer wavelengths following the cut-off-wavelength, the long pass filters then have a very high transmission of greater than 80%, preferably approximately 90% to more than 95% so that the filters allow the passage of radiation in particular in the red wavelength range.

Long pass filters of this type can also be used in a particularly well manner to absorb the blue primary radiation of the radiation source largely entirely, at least by 80, 90 or 95% or up to 100% so that lighting devices the spectrums of which do not or only hardly have parts of primary light can be realized in a particularly simple manner.

The filter particles may absorb the shortwave range of the secondary radiation in the wavelength range below 610 nm, preferably below 620 nm, yet more preferably below 630 nm. Thus, particularly the short-wave parts of the converted secondary radiation are absorbed by the filter particles so that a longer-wave shift of the secondary radiation toward the deep-red range results.

Filter particles that mainly absorb the short-wave parts of the converted secondary radiation can be the above described long pass filters with cut-off wavelengths of 590 to 640 nm, or of 590 to 610 nm, preferably 600 to 610 nm, for example. Besides the especially short-wave blue primary light of the radiation source, the filters additionally also absorb the short-wave parts of the converted secondary radiation.

The filter particles may be filter glasses particularly colored in their volume, which comprise the filter materials (e.g., metal oxides) in their volume and which do not only have a filter coating on the glass.

The filter particles can be produced in that a filter glass colored in its volume, which is a square with an edge length of 5 cm and a thickness of 2 to 3 mm, for example, is ground with mortar and pestle. The pre-ground material will then be ground in a mortar mill (RM-100 of Retsch GmbH company, grinding pressure pestle 4 to 6) for 2 to 6 minutes and subsequently sieved over a 31 μm filter gauze.

The filter particles may alternatively or additionally to the ground filter glass comprise or consist of a second phosphor, wherein the second phosphor absorbs at least part of the secondary radiation and converts it into longer-wave red radiation. In particular, a phosphor can be used as a second phosphor that absorbs radiation at higher wavelengths compared to the first phosphor. For example, the above mentioned phosphor of the general formula $M_2(Al,Si)_5(N,O)_8$ may be used as the first phosphor, and one of the above mentioned $CaAlSiN_3$ phosphors can be employed as the second phosphor, which has a longer-wave dominant wavelength compared to the first phosphor of the general formula $M_2(Al,Si)_5(N,O)_8$ and which was selected to be suitable in terms of its absorption characteristic.

The first or the second phosphor can be a phosphor of the general formula $M_2(Al,Si)_5(N,O)_8$ with M=Ca, Sr, Ba and Eu as activator, in particular $Ca_{0.1}Sr_{0.4}Ba_{0.5})_2Si_5N_8$ (3.5% to 5% Eu) or $Ca_{0.025}Sr_{0.0475}Ba_{0.5})_2Si_5N_8$. Phosphors of this type are disclosed, for example, in WO 2001/39574 A1, WO 2004/055910 A1, EP 143383, and WO 2010/057745 A1, to which reference is made hereby in their entirety. The phosphors may have a dominant wavelength range of approximately 575 to 610 nm.

Here and in the following, %-indications for the activator, in particular Eu, are to be understood as mole % indications with respect to the molar fraction of the alkaline earth metal in the respective phosphor.

The term dominant wavelength particularly relates to the wavelength that results as an intersection of the spectral color line of the CIE standard color system with a straight line, with the straight line running through the actual color location of the radiation, starting from the white point of the CIE standard color system. Generally, the dominant wavelength differs from a wavelength of maximum intensity. In particular, the dominant wavelength is in the red spectral range in smaller wavelengths than the wavelength of maximum intensity since the human eye has a lower sensitivity to deep-red light.

Furthermore, the first or second phosphor may also comprise the elements M, A, D, E and X, wherein M is one or more element selected from the group consisting of: Mn, Ce, Pr, Nd, Sm, Eu, Tb, Dy, Ho, Er, Tm and Yb and A is one or more element selected from the group consisting of divalent metal elements, which are different to M; D is one or more element selected from the group consisting of tetravalent metal elements, E is one or more element selected from the group consisting of trivalent metal elements, X is one or more element selected from the group consisting of: O, N, and F and which has the same crystal structure as $CaAlSiN_3$. Phosphors of this type as well as synthesis thereof are particularly described in EP 1 696 016 A1, to which reference is hereby made in their entirety.

$CaAlSiN_3$ phosphors of this type have a dominant wavelength of approximately 590 to 610 nm and are thus also suitable to be used as the first phosphor in lighting devices. Furthermore, phosphors of the general formula $(M_{1-x}Eu)_x(Al,Q)(Si,Y)N_3$ can be used as the first or second phosphors, with M=Ca, Sr per se or in combination or in combination with other divalent and/or monovalent elements, for example, Li, Q=trivalent cation different from $Al^{3+}$, Y=other tetravalent cations different from $Si^{4+}$, $N^{3-}$ can be partially substituted by $O^{2-}$, $F^-$, $Cl^-$, $Br^-$, $C^{4-}$.

Furthermore, the first and second phosphor may include an inorganic substance, which in its composition at least includes element D, element Al, element AX, element SX and element NX, wherein D represents one, two or more element(s) from the group Mn, Ce, Pr, Nd, Sm, Eu, Tb, Dy, Ho, Er, Tm and Yb, Al represents one, two or more element(s) from the group of divalent metals that are not included in D, SX represents one, two or more element(s) from the group of tetravalent metals, AX represents one, two or more element of the group of the trivalent metals and NX represents one, two or more element(s) from the group O, N, S, C, Cl, F and which has the same crystal structure as $Sr(Sr_{1-a}Ca_a)Si_2Al_2N_6$. In particular, the phosphor may have the general structure $Sr(Sr_{1-a}Ca_a)Si_2Al_2N_8$. In particular, the phosphor may have the general structure $Sr(Sr_{1-a}Ca_a)Si_2Al_2N_8$ with a ranging between 0.6 and 1.0 or between 0.8 to 1.0, respectively.

Synthesis of phosphors of this type is described in DE 102014102853.8, filed 4 Mar. 2014, to which reference is hereby made in its entirety.

The phosphor may have the general molecular formula $Sr(Sr_aCa_{1-a})Si_2Al_2N_6:D$. D is at least an activation element. Oftentimes, D is formed by element Eu and/or also Ce. Other or additional activation elements or dopants can be selected from the group Mn, Ce, Pr, Nd, Sm, Eu, Gd, Tb, Dy, Ho, Er, Tm, Yb and Lu in each case alone or in combination. It is possible for the phosphor to comprise further elements, e.g., in the form of contaminants, with the contaminants taken together preferably should have a weight fraction of the phosphor of at most 0.1 per mill or 100 ppm or 10 ppm, parts per million.

Furthermore, a method of producing a phosphor of this type is provided. Features of the phosphor are thus also disclosed for the method and vice versa.

The method may comprise at least the following steps, preferably in the stated order:
A) Providing reactants present as solids for Sr, Al, Si and Eu as well as optionally for Ca,
B) Mixing the reactants,
C) Heating the reactants to at least 1500° C. under a forming gas atmosphere and forming a calcinated cake, and
D) Grinding the calcinated cake into the phosphor.

At least method step C) or even all steps may be performed under approximately atmospheric pressure. In particular, the method is then not performed under high pressure conditions. Preferably, atmosphere pressure and/or an overall pressure is/are between including 0.9 bar and 1.5 bar or 0.95 bar and 1.05 bar.

The respective pure metals or even metal alloys with the corresponding metals can be used as reactant and as source for strontium, aluminum and/or calcium. Just as well, silicides, hydrides, nitrides, oxinitrides, halides and/or oxides of the metals can be employed as reactants. Furthermore, mixtures of the compounds can be used.

A silicon metal compound, a silicon nitride, an alkaline earth silicide, a silicon diimide or a mixture of the compounds can be used as reactant or a source for silicon for the production of the phosphor. Preferably, silicon nitride and/or silicon metals are used.

Metallic europium, an europium alloy, an europium oxide, an europium nitride, europium hydride or a europium halide can be used as reactant or source for Eu. Just as well, mixtures of the compounds can be used. Preferably, europium oxide is used as reactant for europium.

A melting agent and/or a fluxing agent may be used to improve crystallinity and/or to support crystal growth. To that end, preferably chloride, fluoride, halides and/or boron-containing compounds of the used alkaline earth metals are considered. Also, combinations of two or more melting agents or fluxing agents may be used. In particular, at least one of the following substances serves as melting agent and/or fluxing agent: LiF, LiCl, NaF, NaCl, $SrCl_2$, $SrF_2$, $CaCl_2$, $CaF_2$, $BaCl_2$, $BaF_2$, $NH_4Cl$, $NH_4F$, KF, KCl, $MgF_2$, $MgCl_2$, $AlF_3$, $H_3BO_3$, $B_2O_3$, $Li_2B_4O_7$, $Na_2B_4O_2$, $Na_2B_4O_7$, $LiBF_4$. Also $NH_4HF_2$, $NaBF_4$, $KBF_4$, $EuF_3$ and compounds derived therefrom such as hydrates are suitable.

The starting substances, in particular for Sr, Ca, Al and/or Si as well as Eu, may be weighted-in according to the general molecular formula of the light-emitting substance. It is possible that the alkaline earth components Sr, Ca are also weighted-in with a surplus to compensate for possibly occurring vaporization losses during the synthesis. Furthermore, it is also possible to employ Ba as alkaline earth component.

A step E) may follow step D). In step E), another calcination of the phosphor is effected, which can also be referred to as tempering. Calcination is particularly effected at a temperature of at least 1500° C. and preferably under a nitrogen atmosphere or forming gas atmosphere. Forming gas refers to a mixture of $N_2$ and $H_2$. The temperature of at least 1500° C. in steps C) and/or E) is preferably applied for at least four hours or six hours. For example, in steps C) and E), in each case a temperature of 1650° C.+/−50° C. is applied.

Alternatively, steps C) and D) may be repeated instead of step E).

A mixing of the reactants may be conducted in a ball mill or a turbulant mixer. In the mixing process, it may be advantageous to select the conditions such that a lot of energy is introduced into the mix, resulting in a grinding of the reactants. The homogeneity and reactivity of the mixture achieved thereby may have a positive effect on the properties of the resulting phosphor.

By modifying the bulk density in a targeted manner or modifying the agglomeration of the reactant mix, the development of side phases may be reduced. Moreover, a particle size distribution, a particle morphology and/or a yield of the resulting phosphor can be influenced. Sieving and granulizing are especially suitable techniques used to that end, also by use of suitable additives.

Tempering may be effected, in particular in a crucible of wolfram, molybdenum or boron nitride. Tempering is preferably effected in a gas-tight furnace in a nitrogen atmosphere or in a nitrogen/hydrogen atmosphere. The atmosphere can be fluent or stationary. Further, carbon may be present in the furnace in a finely distributed form. Multiple tempering of the phosphors is possible to improve crystallinity or grain size distribution or influence the latter two in a targeted matter. Further advantages may be a low defect density in conjunction with improved optical properties of the phosphor and/or increased stability of the phosphor. Between the tempering processes, the phosphor can be treated in various forms or substances such as melting agents may be added to the phosphor.

For example, a mortar mill, a fluidized bed mill or a ball mill may be employed to grind the phosphor. Preferably, it is to be observed that the fraction of then generated splinter grains is kept as low as possible since the fraction may deteriorate the optical properties of the phosphor.

The phosphor may additionally be washed. To that end, the phosphor can be washed in water or aqueous acids such as hydrochloric acid, nitric acid, hydrofluoric acid, sulfuric acid, organic acids or a mixture thereof. In addition or as an alternative, the phosphor can be washed in alkali such as sodium hydroxide solution, potassium hydroxide solution, an aqueous ammonia solution or mixtures thereof. As an alternative or in addition, it is possible for the washing to be performed in organic solvents such as acetone, propanol and/or phenol. Preferably, washing is effected after grinding.

Removal of side phases, glass phases or other contaminants and thus an improvement of the optical properties of the phosphor may be effected by the tempering, further calcination, grinding, sieving and/or washing. It is also possible to remove or dissolve small luminescent particles in a targeted manner and influence the particle size distribution for the application by the treatment. Furthermore, a surface of the luminescent particles can be modified in a targeted manner by such a treatment such as the removal of certain components from the particle surface. The treatment, also in conjunction with a subsequent treatment, may result in an improved stability of the phosphor. In particular, application of a protection layer is possible, as generally known per se.

One example of a phosphor of the general formula $Sr(Sr_aCa_{1-a})Si_2Al_2N_6:D$ can be produced as follows:

The binary nitrides of the constituting elements, namely $Ca_3N_2$, $Sr_3N_2$, AlN and $Si_3N_4$ are used as reactants for the synthesis of the phosphor of the general formula $Sr(Sr_aCa_{1-a})Si_2Al_2N_6:Eu$. Due to the fact that these are substances that are strongly sensitive to oxidation and hydrolysis, the whole process ensues in a glove box under a $N_2$ atmosphere with $O_2<1$ ppm and $H_2O<1$ ppm. Additionally, $Eu_2O_3$ is used for doping with $Eu^{2+}$. Weighting-in is effected such that the following atomic ratio is present in a simplified illustration:

Sr:Ca:Si:Al:Eu=(1+a):(1−a):2:2:y, where y is the doping level, i.e., the fraction of the bivalent lattice sites substituted by Eu. In addition, various fluxing agents are added, see the above description. For example, a reactant mix is scaled to a total weight-in amount of 50 to 100 g while observing the atomic ratios described above. However, use of other total weight-in amounts is also possible.

For example, the reactant mix is added to a PET mixing vessel together with $ZrO_2$ balls and mixed on a roller bank in the glove box for 6 hours (h). Subsequently, the balls are removed from the mixture and the powder is transferred into a closed molybdenum crucible. The crucible is laid into a wolfram over-crucible, a half-round open tube of wolfram, and transferred in to a tube furnace. During the operating time, the tube furnace is flown through with 3 l of forming gas per minute, the forming gas of 92.5% $N_2$ and 7.5% $H_2$. In the tube furnace, the mixture is heated to 1650° C. at a rate of 250 K/h, maintained at the temperature for 4 hours and subsequently cooled down to 50° C. at 250 K/h. The resulting calcinated cake is removed after the furnace has cooled, ground with a mortar mill and sieved over a sieve with a mesh size of 31 µm. The sieve fraction <31 µm is the used phosphor.

Sieving can be followed by an optional calcination, tempering and/or washing and/or coating process.

Exemplary weighted-in amounts m in g as well as resulting color locations CIE x, CIE y, also referred to as color locus or chromaticity coordinate, of the emission spectrum of the respective phosphor in the CIE standard color system when excited with blue light at 460 nm and with complete absorption of the blue light are indicated in FIGS. 5/1 to 5/3 in table form. Weighted-in amounts with x≤0.8 relate to conventional phosphors, while weight-in amounts with x>0.8 (corresponds to a ≤0.6) indicate phosphors of the general formula $Sr(Sr_aCa_{1-a})Si_2Al_2N_6:D$.

Furthermore, according to another example, the first phosphor may be embedded in a first matrix material, which is both transparent for primary radiation and for the converted secondary radiation and which may be selected from a group of materials consisting of: glass, silicone, epoxy resin, polysilazane, polymethacrylate and polycarbonate as well as combinations thereof In particular, polymethyl methacrylate (PMMA) may be used as polymethacrylate. By embedding the first phosphor into a matrix material, for example, in a potting material surrounding the primary light source, for example, an LED, the first luminescent particles can be processed in a particularly well manner. As an alternative or in addition, the first luminescent particles can also be formed as ceramic, for example, as a ceramic disc that is arranged in the beam path of the primary radiation emitted by the radiation source.

In analogy to the matrix material of the first phosphor, the filter particles may also be embedded in a second matrix material, resulting in a highly improved processability of the filter particles, in particular with respect to small LEDs or LED modules. Compared to conventional filter glasses having a predefined size and thickness, the filter particles provide the advantage that their concentration may be adapted to the small LEDs as point light sources in a particularly simple manner. The second matrix material may be selected to be particularly in analogy to the first matrix material and be employed from a group consisting of silicone, polycarbonate, epoxy resin, polysilazane, polymethacrylate as well as glass provided that filter particles are used as second luminescent particles. As polymethacrylate, in particular polymethyl methacrylate (PMMA) may be used.

The first phosphor and the filter particles can thus be present in particular in separate layers according to some examples of lighting devices. As an alternative, it is also possible that the first phosphor and the filter particles are mixed together in one single layer and particularly the first phosphor and the filter particles are introduced in a matrix material, for example, the first matrix material.

Besides the first phosphor as well as the filter particles eventually containing the second phosphor, if applicable, even further non-luminescent particles such as scattering particles as well as diffusers may be present in the beam path of the radiation source.

In the following, several examples of lighting devices are to be explained with reference to the figures in further detail. The figures are particularly not made to scale, with like elements being provided with like reference numerals.

FIG. 1A shows a lighting device 1 in a cross-sectional view, in which filter particles 4 and a first phosphor 3 are together present in a volume potting around the LED chip, the radiation source 2. The filter particles 4 and the first phosphor 3 are dispersed in a first matrix material 5. The blue primary radiation of the LED chip 2 is converted into orange to red secondary radiation at the first luminescent particles 3, wherein the secondary radiation is then in turn filtered by the filter particles 4 such that particularly the short-wave orange fractions of the red secondary light are absorbed. At the same time, the filter particles may absorb the blue primary radiation in a particularly simple manner, provided that the filter particles are ground glass filter particles so that a full conversion LED may be realized, which converts the entire blue primary radiation into deep-red secondary radiation.

Figure 1B:
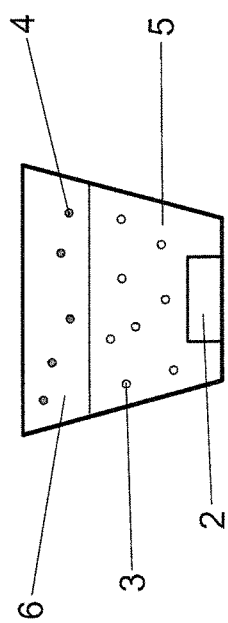

FIG. 1B shows an alternative example of the lighting device of FIG. 1A, wherein in the device of FIG. 1B, the filter particles 4 are present in a separate layer with a second matrix material 6. The filter particles follow the first luminescent particles 3 in the first matrix material 5 in the beam path of the LED chip 2. In such an arrangement, provided the filter particles comprise a second phosphor, the secondary radiation formed at the first luminescent particles 3 may be further filtered or converted by being scattered at the filter particles 4 following in the beam path.

Figure 1C:
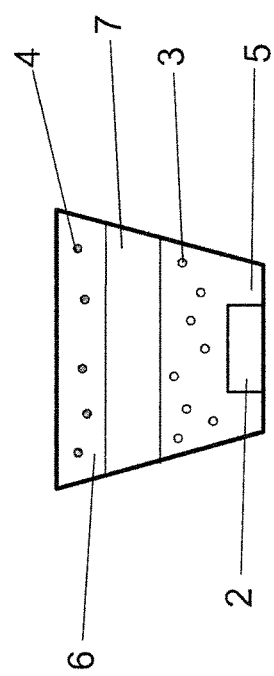

FIG. 1C shows a further example of a lighting device in a cross-sectional view, in which filter particles 4 in the second matrix material 6 are arranged in a separate layer compared to the first luminescent particles 3 in matrix material 5, with an interspace 7 being present between the two layers. In such an arrangement, specifically the conversion heat, which develops along with the conversion of primary radiation at the first luminescent particles 3, will not have a negative effect to the filtering performance of the filter particles 4 in the separate layer.

Figure 1D:
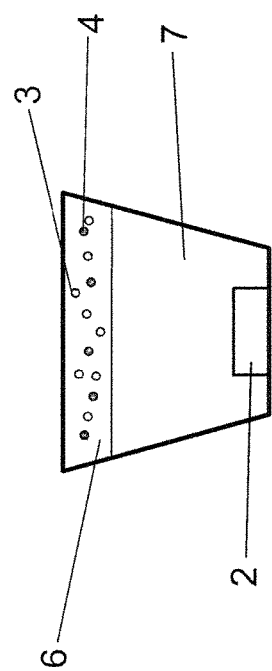

FIG. 1D shows an alternative example compared to FIG. 1C, in which both the filter particles 4 and the first phosphor 3 are present in the second matrix material 6. The common layer is arranged at a distance to the LED chip as a primary radiation source 2 via an interspace 7, presenting a "remote conversion" in this case.

Figure 1E:
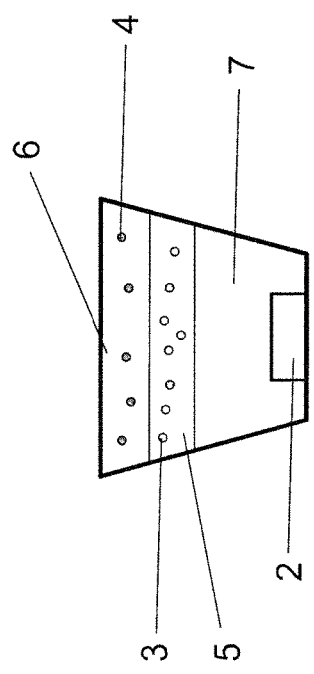

FIG. 1E shows two separate layers in a cross-sectional view, which contain the filter particles 4 in a second matrix material 6 and the first phosphor 3 in a first matrix material 5, with the filter particles again following the first phosphor in the beam path of the radiation source 2. Again, in this "remote conversion" configuration, there is an interspace 7 between the primary radiation source 2 and the two layers having filter particles 4 and the first phosphor 3.

Figure 1F:
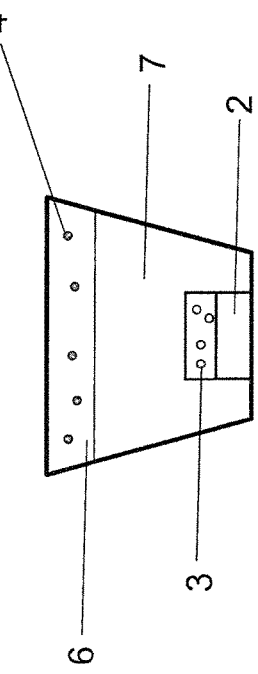

FIG. 1F shows another possible example in which the first luminescent particles 3 are present directly on the primary radiation source 2, for example, in the form of a "phosphor in glass" or a ceramic disc. The filter particles 4 embedded in the second matrix material 6 and separated by the interspace 7 from the primary radiation source 2 and the luminescent particles 3.

Figure 1G:
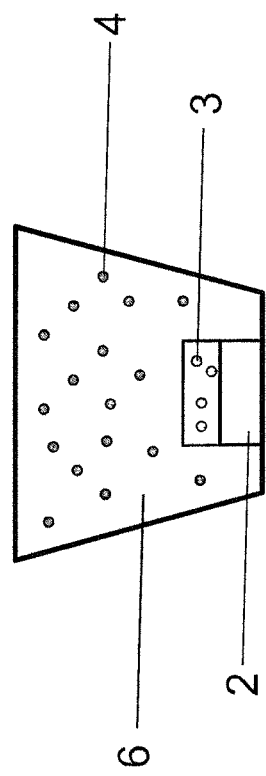

FIG. 1G shows a volume potting with filter particles 4 in a second matrix material 6, which encloses the LED chip 2 with a layer thereon, in which the first luminescent particles 3 are present.

In the following, specific examples of lighting devices are to be described in further detail. In all three examples, a silicone potting is applied to an indium gallium nitride LED chip (InGaN chip), the first luminescent particles being present therein. Filter glass particles in a second matrix material, likewise a silicone potting, was arranged on the LED chip bearing the potting.

The table of FIG. 2A shows the dominant wavelengths $\lambda_{dom(blue\ LED)}$ of the InGaN LED chips as primary light sources, the chemical formulas of the used luminescent particles as well as the filter material used for the example of the lighting device (example 1), a ground long pass glass filter R-60 of HOYA company. Concentrations of the filter particles as well as of the phosphor are each indicated in weight %. x and y describe the CIE chromaticity coordinates of the emitted converted light, and $\lambda_{dom}$ indicates the dominant wavelength of the radiated converted red light. Further, the light flux $\Phi_{v(filled)}$ as well as the radiation power $\Phi_{e(filled)}$ of the potted LED arrangement are illustrated compared to an LED arrangement without potting $\Phi_{e(nocast)}$.

In comparative example 1, merely one phosphor of the general formula $M(Al,Si)_5(N,O)_8$ was introduced into the potting, without a filter material following the phosphor in the beam path. This comparative example has the same color location as the example 1. In comparative example 2, a different phosphor of the general formula $M_2(Al,Si)_5(N,O)_8$ was embedded in the potting without filter particles, and in example 1, the same phosphor as in comparative example 2 was used as a first phosphor, and a ground Hoyar R-60 filter glass was used as filter particle. The filter glass has been ground in a mortal mill RM-100 (producer: RETSCH GmbH, grinding pressure for pestle: 8) for six minutes and subsequently sieved by a fine sieve, with only the fine fraction having a particle diameter <31 µm being used. A silicone plate with the filter particles, which has a thickness of 0.7 to 0.8 mm, was produced and placed over the LED.

Figure 2B:
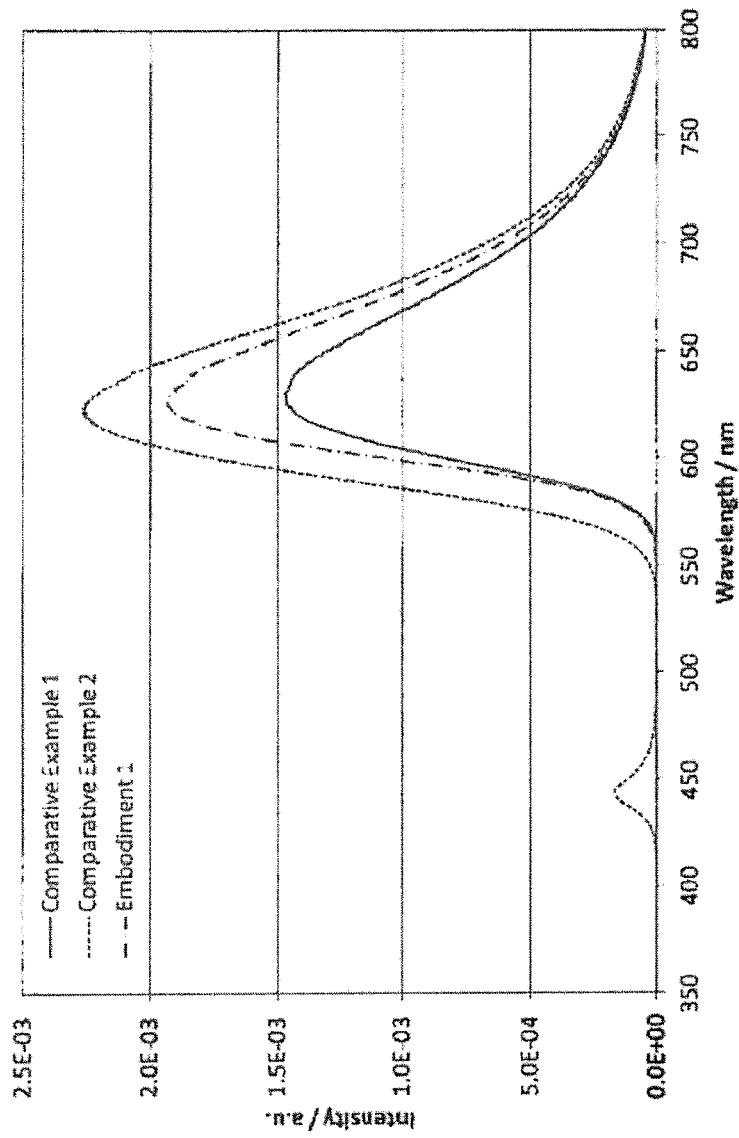

It is clearly discernable that our lighting device according to example 1 has a very high color purity with a significantly improved light flux and increased radiation power compared to example 1. Comparative example 2 has the same LED as example 1, but does not contain the pulverulent filter with the filter particles. This LED device has a lower color purity than the LED of example 1 and, in addition, has a color location that is outside the respective regulation for automotive applications "Regulation No. 48 of the United Nations Economic Commission for Europe (UN/ECE)— Uniform provisions concerning the approval of vehicles with regard to the installation of lighting and light-signaling devices." The respective emission spectra of the comparative examples 1 and 2 as well as of the example 1 are shown in FIG. 2B.

Example 2 according to the table in FIG. 3A shows comparative example 3, in which a blue-emitting LED is potted with a phosphor without filter particles. Comparative example 4 shows the same LED arrangement as example 2, but without filter particles. The comparative LED has a lower color purity than the LED of example 2 and a color location outside the statutory color locations for automotive applications in the red range. In Example 2, a 1:1 (weight %) mix of filter glass particles of the ground HOYA R-60 filter glass and the ground Schott RG610 filter glass with cut-off wavelengths of 600 nm and 610 nm, respectively, was produced according to the above described method.

Figure 3B:
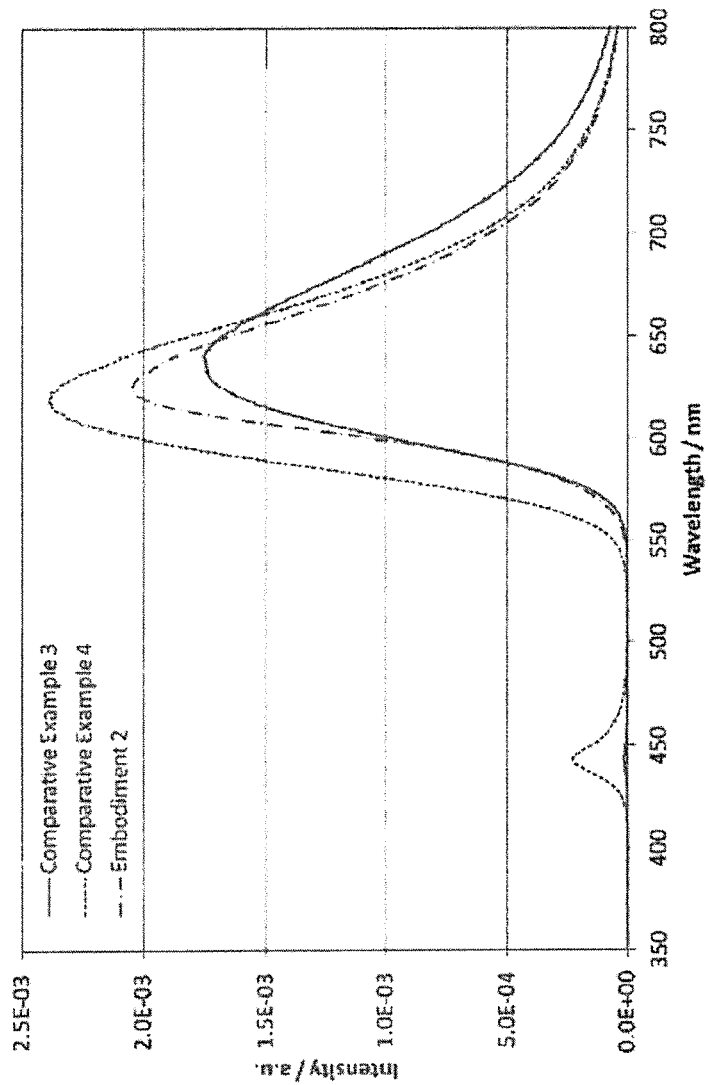

FIG. 3B shows the LED emission spectra of comparative examples 3 and 4 compared to the example 2 of. Again, it is discernable that in the comparative examples either the fractions of short-wave conversion radiation are increased compared to the example or the intensity of the converted deep-red light is reduced compared to the example.

Figure 4B:
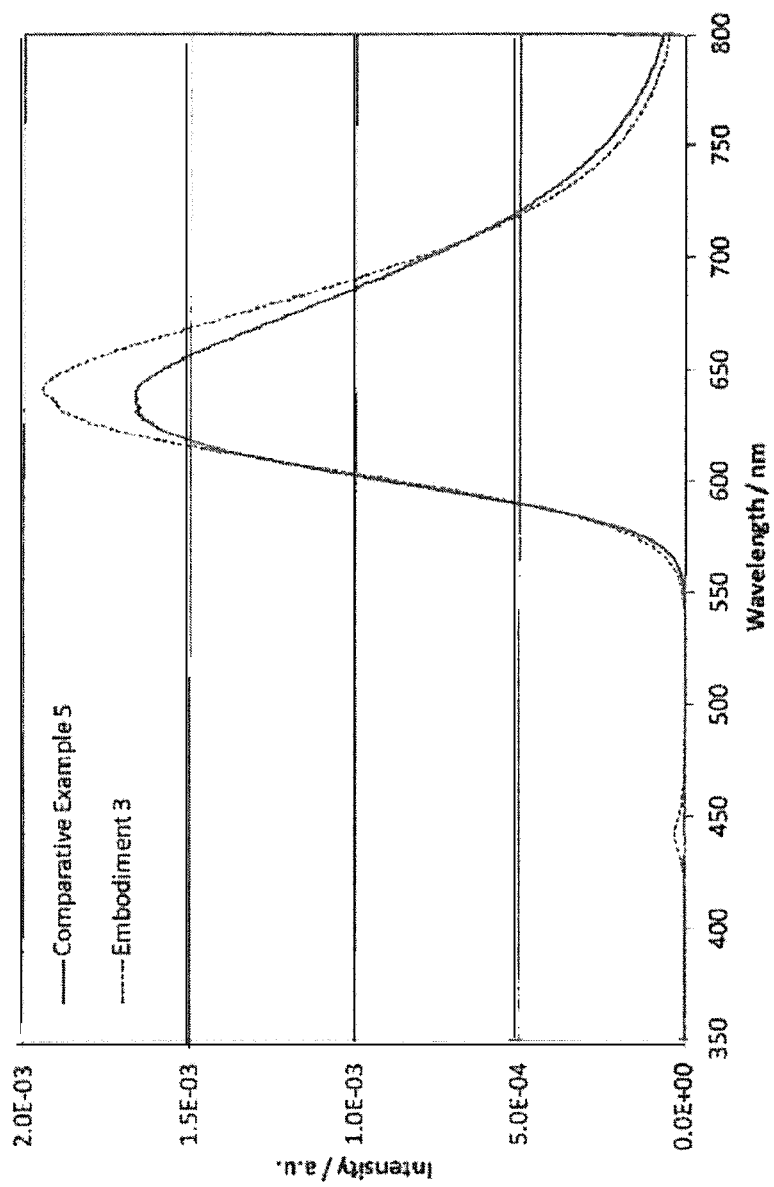

In example 3 of the table of FIG. 4A, in our lighting device, again a phosphor of the general formula $M_2(Al,Si)_5(N,O)_8$ was used as first phosphor in the potting material, with a second phosphor, namely a $CaAlSiN_3$ phosphor having 0.4% europium as activator, was used as filter particle material in the silicone plate. The second phosphor absorbs the short-wave orange and red fractions of the converted secondary light and emits them in the longer-wave red range. Comparative example 5 is an LED, in the potting of which merely one phosphor is present without filter particles. The emission spectrum of FIG. 4B clearly shows that an increased intensity can be achieved by example 3 compared to comparative example 5, with the color purities of both LEDs being approximately comparable.

Our light devices and methods are not limited by the description with reference to the examples. The disclosure rather comprises any new feature as well as any combination of features, particularly including any combination of features in the appended claims, even if the feature or the combination per se is not explicitly indicated in the claims or the examples.

This application claims the priority of DE 10 2014 105 588.8 and DE 10 2014 107 972.8, the subject matter of which are incorporated herein by reference.

The invention claimed is:

1. A lighting device comprising:
   a radiation source that emits primary radiation in the wavelength range of 300 nm to 570 nm;
   a first phosphor arranged in a beam path of the primary radiation source that converts at least part of the primary radiation into orange-to-red secondary radiation in a wavelength range of 570 nm to 800 nm; and
   filter particles comprising or consisting of ground filter glass arranged in a beam path of the secondary radiation that absorb at least part of the secondary radiation, wherein a transmission spectrum of the filter particles has a cut-off wavelength of 590 nm to 640 nm.

2. The lighting device according to claim 1, wherein particles of the filter particles have a grain size of <50 µm.

3. The lighting device according to claim 1, wherein the filter particles comprise or consist of a second phosphor, and the second phosphor absorbs at least part of the secondary radiation and converts it into tertiary radiation.

4. The lighting device according to claim 1, wherein the first or the second phosphor has general formula $M_2(Al,Si)_5(N,O)_8$ with M as one or more elements selected from the group consisting of Ca, Sr, Ba and Eu as activator.

5. The lighting device according to claim 1, wherein the first or second phosphor comprises elements M', A, D, E, and X, wherein M' is one or more element(s) selected from the group consisting of Mn, Ce, Pr, Nd, Sm, Eu, Tb, Dy, Ho, Er, Tm and Yb, A is one or more element(s) where each element is a divalent metal element(s) which is different from M, D is one or more element(s) selected from the group consisting of tetravalent metal elements, E is one or more element(s) selected from the group consisting of trivalent metal elements, X is one or more element(s) selected from the group consisting of: O, N and F, and which has the same crystal structure as $CaAlSiN_3$.

6. The lighting device according to claim 1, wherein the first or a second phosphor includes an inorganic substance, which in its composition includes at least element D, element Al, element AX, element SX and element NX, wherein D represents one, two or more element(s) of the group Mn, Ce, Pr, Nd, Sm, Eu, Tb, Dy, Ho, Er, Tm and Yb, Al represents one, two or more element(s) of the group of divalent metals that are not included in D, SX represents one, two or more element(s) of the group of tetravalent metals, AX represents one, two or more element(s) of the group of trivalent metals, and NX represents one, two or more element(s) of the group O, N, S, Cl, F and has the same crystal structure as $Sr(Sr_{1-a}Ca_a)Si_2Al_2N_6$.

7. The lighting device according to claim 1, wherein the first phosphor is embedded in a first matrix material.

8. The lighting device according to claim 7, wherein the first matrix material is selected from the group of materials consisting of glass, silicone, epoxy resin, polysilazane, polymethacrylate, polycarbonate and combinations thereof.

9. The lighting device according to claim 1, wherein the first phosphor is present as a ceramic converter element.

10. The lighting device according to claim 1, wherein the filter particles are embedded in a second matrix material.

11. The lighting device according to claim 10, wherein the second matrix material is selected from the group of materials consisting of silicone, epoxy resin, polysilazane, polymethacrylate, polycarbonate and combinations thereof.

12. The lighting device according to claim 1, wherein the first phosphor and the filter particles are mixed with one another.

13. The lighting device according to claim 1, wherein the first phosphor and the filter particles are arranged at a distance to the radiation source.

14. The lighting device according to claim 1, wherein the filter particles are spaced further apart from the radiation source than the phosphor.

15. The lighting device according to claim 1, wherein the first phosphor and the filter particles are present in a ceramic layer.

16. The lighting device according to claim 1, wherein the filter particles are arranged at a larger distance to the radiation source than the first phosphor.

* * * * *